US012641870B2

(12) United States Patent
Ikeda et al.

(10) Patent No.: US 12,641,870 B2
(45) Date of Patent: May 26, 2026

(54) SERIES ADDRESSING SCHEME FOR SMART POWER STAGES OF HIGH CURRENT APPLICATIONS

(71) Applicant: Renesas Electronics America Inc., Milpitas, CA (US)

(72) Inventors: Yuji Ikeda, Kanagawa (JP); Chun Cheung, Bridgewater, NJ (US); Bo Wang, Easton, PA (US); Andrew Laurence Webb, Hamilton, NJ (US); Shunya Yamane, Gunma (JP)

(73) Assignee: Renesas Electronics America Inc., Milpitas, CA (US)

( * ) Notice: Subject to any disclaimer, the term of this patent is extended or adjusted under 35 U.S.C. 154(b) by 50 days.

(21) Appl. No.: 18/586,199

(22) Filed: Feb. 23, 2024

(65) Prior Publication Data

US 2025/0275231 A1　Aug. 28, 2025

(51) Int. Cl.
H10D 84/80 (2025.01)
(52) U.S. Cl.
CPC ................................. H10D 84/811 (2025.01)
(58) Field of Classification Search
CPC .................................................... H10D 84/811
See application file for complete search history.

(56) References Cited

U.S. PATENT DOCUMENTS

2018/0120910 A1*　5/2018　Farkas ...................... G06F 1/26
2024/0178841 A1*　5/2024　Sayginer .................. H01Q 3/34

* cited by examiner

*Primary Examiner* — Daniel C Puentes
(74) *Attorney, Agent, or Firm* — SCULLY, SCOTT, MURPHY & PRESSER, P.C.

(57) ABSTRACT

A semiconductor device package is disclosed that includes an address voltage supply pin connection, an address voltage output pin connection, a first power driver having a first address pin connection and a second power driver having a second address pin connection. The first address pin connection is connected to the address voltage supply pin connection via a resistor. The first power driver is configured to generate a first indication of a first address based on a voltage on the first address pin connection that is obtainable by a controller to determine the first address. The second address pin connection is connected to the first address pin connection and the address voltage output pin connection. The second power driver is configured to generate a second indication of a second address based on a voltage on the second address pin connection that is obtainable by the controller to determine the second address.

19 Claims, 10 Drawing Sheets

100

SERIES ADDRESSING SCHEME FOR SMART POWER STAGES OF HIGH CURRENT APPLICATIONS

BACKGROUND

The present disclosure relates to systems, devices and methods for an addressing scheme for multiple power stages.

Different devices can be connected to each other in different configurations, such as a master-subordinate configuration. A master-subordinate configuration is where a master device controls a subordinate device. An example system utilizing the master-subordinate configuration is a power delivery system where a controller is the master, and one or more power stages are the subordinate devices. A passive external network including wires or traces can connect different interface pins, including input and output pins, of the controller and the power stages. The interface pins can be used by the controller to provide commands to the power stages, and also for the power stages to provide feedback signals encoding various operating conditions to the controller to operate the power stages.

SUMMARY

In an embodiment, a semiconductor device package is disclosed that comprises an address voltage supply pin connection, an address voltage output pin connection, a first power driver having a first address pin connection and a second power driver having a second address pin connection. The first address pin connection is connected to the address voltage supply pin connection via a resistor. The first power driver is configured to generate a first indication of a first address corresponding to the first power driver based on a voltage on the first address pin connection. The first indication is obtainable by a controller to determine the first address of the first power driver. The second address pin connection is connected to the first address pin connection and the address voltage output pin connection. The second power driver is configured to generate a second indication of a second address corresponding to the second power driver based on a voltage on the second address pin connection. The second indication is obtainable by the controller to determine the second address of the second power driver.

In an embodiment, a system is disclosed that comprises a voltage power supply connection, a ground connection, a first power driver having a first address pin connection and a first offset pin connection, a second power driver having a second address pin connection and a second offset pin connection, a third power driver having a third address pin connection and a third offset pin connection and a fourth power driver having a fourth address pin connection and a fourth offset pin connection. The first power driver is configured to generate a first indication of a first address corresponding to the first power driver based on a voltage on the first address pin connection and a voltage on the first offset pin connection. The first indication is obtainable by a controller to determine the first address of the first power driver. The second power driver is configured to generate a second indication of a second address corresponding to the second power driver based on a voltage on the second address pin connection and a voltage on the second offset pin connection. The second indication is obtainable by a controller to determine the second address of the second power driver. The first address pin connection and the second address pin connection are electrically connected in series between the voltage power supply connection and the ground connection via at least a first resistor. The third power driver is configured to generate a third indication of a third address corresponding to the third power driver based on a voltage on the third address pin connection and a voltage on the third offset pin connection. The third indication is obtainable by a controller to determine the third address of the third power driver. The fourth power driver is configured to generate a fourth indication of a fourth address corresponding to the fourth power driver based on a voltage on the fourth address pin connection and a voltage on the fourth offset pin connection. The fourth indication is obtainable by a controller to determine the fourth address of the fourth power driver. The third address pin connection and the fourth address pin connection are electrically connected in series between the voltage power supply connection and the ground connection via at least a second resistor.

In an embodiment, a system is disclosed that comprises a plurality of semiconductor packages. Each semiconductor package comprises a first power driver, a second power driver, an address pin input connection and an address pin output connection. The address pin input connection is electrically connected to the address pin output connection internal to the semiconductor package. The first power driver comprises a first address pin electrically connected between the address pin input connection and the address pin output connection. The second power driver comprises a second address pin electrically connected between the address pin input connection and the address pin output connection. The plurality of semiconductor packages are electrically connected in series between a voltage power supply connection and a ground connection via the address pin input connection and the address pin output connection. At least one resistor is electrically disposed between the address pin input connection and the first and second address pins.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

Figure 1:
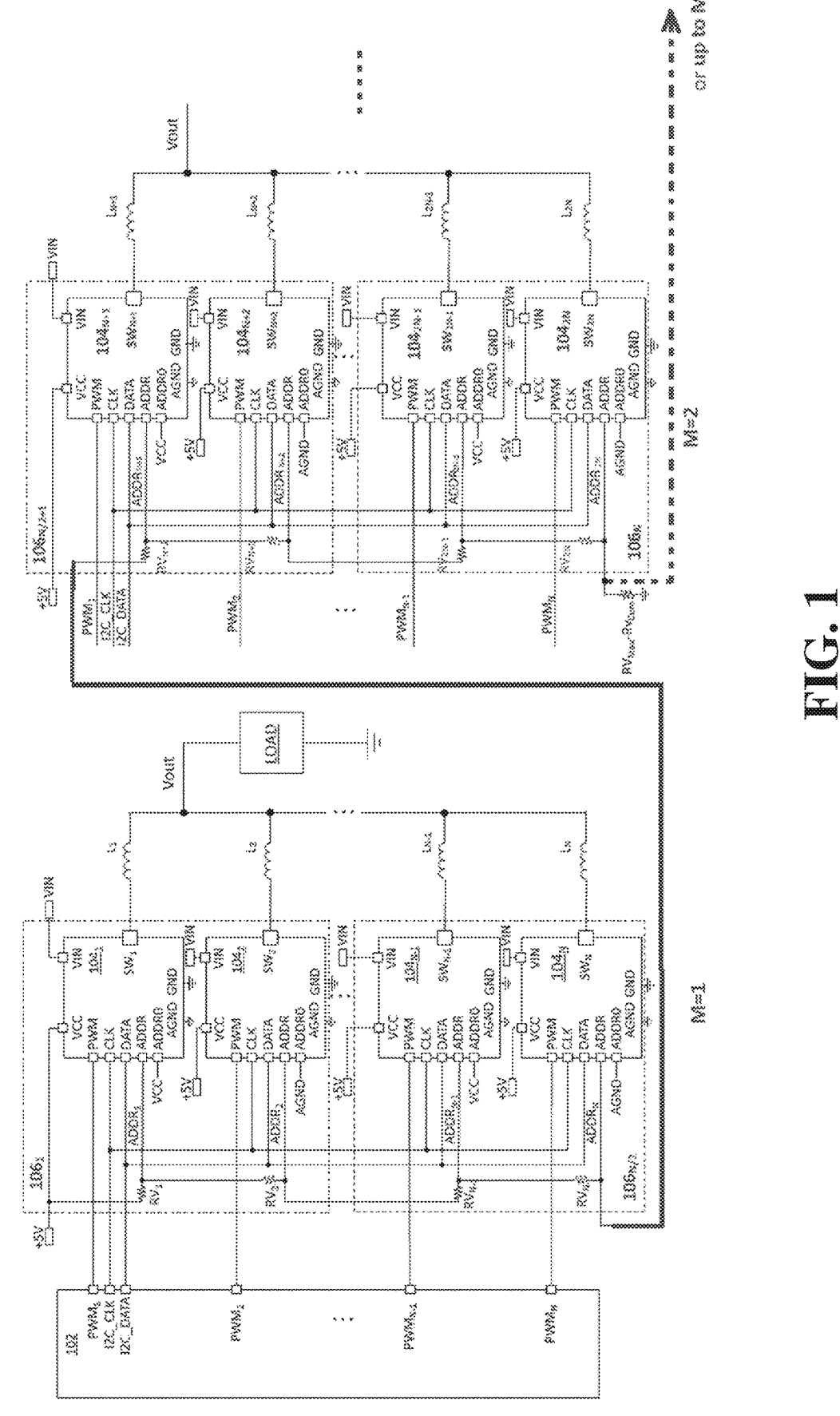
FIG. 1 is a block and circuit diagram of an example vertical power delivery system according to an embodiment.

With reference to FIG. 1 an example system 100 is illustrated that is configured to implement a series addressing scheme in a high device count vertical power delivery application according to an embodiment. System 100 may comprise a power delivery system that is configured to generate an output voltage Vout to provide power to a load. System 100 may be a part of a device and may be implemented by one or more semiconductor devices.

System 100 comprises a controller 102 and a plurality of power stages $104_1$, $104_2$, . . . , $104_{N-1}$, $104_N$, individually and collectively referred to as power stages 104. In some embodiments, each power stage 104 may be identical where, for example, each power stage 104 may be formed in the same configuration and layout on a corresponding silicon die and comprise the same interface pins. In some embodiments, a single silicon die may comprise two or more power stages 104 in a semiconductor package. For example, a silicon die comprising power stages $104_1$ and $104_2$ may be referred to as semiconductor package $106_1$ and a silicon die comprising power stages $104_{N-1}$ and $104_N$ may be referred to as semiconductor package $106_{N/2}$. The semiconductor packages $106_1$, . . . , $106_{N/2}$ may also be referred to collectively and individually herein as semiconductor packages 106. Controller 102 may comprise, for example, a microcontroller including hardware such as various analog and digital circuit components. Controller 102 can include, for example, a processor, central processing unit (CPU), field-programmable gate array (FPGA) or any other circuitry that is configured to control and operate various aspects of power stages 104.

In one embodiment, system 100 may comprise a vertical power delivery (VPD) multiphase converter that can support up to 64 smart power stages (SPS) 104 for high current applications (e.g., N*M=64). N is the number of PWM signals from the controller, M is the number of SPS devices in parallel and with the same PWM signal. Power stages 104 may comprise smart power stages (SPS) that include various components configured to perform voltage regulation and to detect and feedback information such as temperature and current to controller 102. A semiconductor package 106 comprising two SPS may also be referred to herein as a dual-phase SPS 106. Each power stage 104 includes power devices, such as a pair of switches implemented by metal-oxide-semiconductor field-effect transistors (MOSFETs). The pair of switches, which can be referred to as high-side switch (e.g., connected between input voltage Vin and corresponding switch node) and low-side switch (e.g., connected between switch node and ground). Controller 102 can be configured to generate and provide control signals, such as pulse width modulation (PWM) signals or pulse frequency modulation (PFM) signals, for power stages 104.

Controller 102 can generate individual control signals for individual power stages. By way of example, controller 102 may provide control signals to power stage $104_1$, $104_2$, . . . , $104_{N-1}$, $104_{N*M}$ via corresponding $PWM_1$, $PWM_2$, . . . . $PWM_{N-1}$, $PWM_N$ output pins of controller 102, which may be referred to herein collectively and individually as PWM output pins of controller 102. Each of power stages $104_1$, $104_2$, . . . , $104_N$*M may receive the corresponding control signal at its PWM input pin. Each power stage 104 may also include a driver circuit configured to generate gate voltages for driving the power switches. The power switches in each power stage 104 may be driven to output voltages at respective switch nodes $SW_1$, $SW_2$, . . . , $SW_{N*M-1}$, $SW_{N*M}$, which may be combined into output voltage Vout by corresponding inductors $L_1$, $L_2$, . . . , $L_{N*M-1}$, $L_{N*M}$.

Controller 102 and power stages 104 may be connected to one another using a passive external network including, for example, wires, traces, transmission lines and various components that can connect the interface pins (e.g., input and output pins) of controller 102 and power stages 104 together. Controller 102 and power stages 104 can exchange signals and other information using the passive external network including, for example, I2C communications via I2C_CLK and I2C_DATA pins of controller 102 and corresponding CLK and DATA pins of each power stage 104. By way of example, the passive external network can route control signals from controller 102 to power stages 104, e.g., via the PWM pins, and can route feedback signals from power stages 104 to controller 102, e.g., via the I2C CLK and DATA communication pins. Any other communication protocols or pin layouts may alternatively be utilized to both route control signals and feedback signals between controller 102 and power stages 104.

In some embodiments, the semiconductor packages 106 or the passive network may comprise resistors $RV_1$, $RV_2$, . . . , $RV_{N*M-1}$ and $RV_{N*M}$ that may be utilized to create different voltages on the ADDR pins of one or more of power drivers 104, enabling the series addressing scheme described in the below embodiments. Resistors $RV_1$, $RV_2$, . . . , $RV_{M*N-1}$ and $RV_{M*N}$ may also be referred to herein collectively and individually as resistor(s) RV. In some embodiments, each resistor RV may comprise the same resistance, e.g., 10 kΩ in some embodiments. Other resistance values may alternatively be utilized. In some embodiments, resistors RV may have 1% and 100 ppm/K or better accuracy in series for a design with 32 power stages 104.

In some embodiments, the ADDR pin of each power driver 104 may have a corresponding resistor RV, ensuring a different voltage $ADDR_1$, $ADDR_2$, . . . , $ADDR_{N*M-1}$, $ADDR_{N*M}$, for each power driver 104. In other embodiments, each semiconductor package 106 may have a single corresponding resistor RV, ensuring a different voltage for each semiconductor package 106 while the individual power drivers 104 within each semiconductor package 106 may have the same voltage on the ADDR pin, e.g., $ADDR_1=ADDR_2$ and $ADDR_{N-1}=ADDR_N$ but $ADDR_1!=ADDR_{N-1}$. As can be seen in FIG. 1, for example, resistors RV2 and RVN are illustrated with dashed lines to show that they are optional. In other embodiments, other configurations of optional or included resistors may be utilized. In some embodiments, one or more resistors RV may be integrated into the silicon die of the corresponding semiconductor package 106. In other embodiments, one or more of resistors RV may be external to semiconductor package 106, e.g., as part of the passive network, surface mounted onto the semiconductor package 106 or connected in another manner.

Depending on the configuration of resistors RV and the number of power drivers 104 that are implemented, an additional resistor $RV_{Max}$-$RV_{Cum}$ may also be utilized. In some embodiments, a maximum ohm value for the addressing scheme, $RV_{Max}$, may be implemented such as, e.g., 320 k$\Omega$ or another value. $RV_{Max}$ may be utilized regardless of the number of power drivers 104 to ensure that there is a consistent address mapping for the power drivers 104. For example, in an ideal configuration, the voltage difference between the ADDR pins of each power driver 104 should be about the same, simplifying the needed analog-digital conversion and identification of the corresponding address values. In an example scenario where $RV_{Max}$ is 320 k$\Omega$, a thirty-two power driver configuration may assign 10 k$\Omega$ of resistance to the RVs of each of the thirty-two power drivers 104, resulting in corresponding voltage values $ADDR_1$, $ADDR_2$, . . . , $ADDR_{N*M-1}$, $ADDR_N$*M at the ADDR pins having differences that are easily quantifiable. In such a case, the thirty-second power driver 104, e.g., power driver $104_{N*M}$, will be connected directly to GND giving an $ADDR_{N*M}$ value of 0. However, in a case where fewer power drivers 104 are utilized, connecting power driver $104_{N*M}$ to GND may result in a significant difference in voltage value between $ADDR_{N*M-1}$ and $ADDR_{N*M}$. In addition, in an example where only two power drivers 104 are utilized or included, e.g., a single semiconductor package 106, the voltage value $ADDR_2$ on the ADDR pin of power driver $104_2$ would have a value of 0 as compared to the corresponding voltage value of $ADDR_2$ on the ADDR pin of power driver $104_2$ when more power drivers 104 are included.

In order to achieve consistent addressing regardless of the number of power drivers 104 that are included, in some embodiments, an additional resistor $RV_{Max}$-$RV_{Cum}$ may be included between the ADDR pin of the last power driver, $104_N$, and ground where $RV_{Cum}$ is the summation of all of the other resistors RV. As an example, if there are thirty-two power drivers 104 each having a corresponding resistor RV at 10 k$\Omega$ and $RV_{Max}$ is 320 k$\Omega$, $RV_{Max}$-$RV_{Cum}$ may have a value of 0, e.g., no resistor is included. However, if only four power drivers 104 are included the $RV_{Max}$-$RV_{Cum}$ resistor provides a value of 280 k$\Omega$ (320 k$\Omega$-40 k$\Omega$) and a 280 k$\Omega$ resistor $RV_{Max}$-$RV_{Cum}$ is connected between the ADDR pin of power driver $104_N$ and ground. The use of resistor $RV_{Max}$-$RV_{Cum}$ in some embodiments ensures that each address always corresponds to the same voltage on the ADDR pin of each power driver 104 regardless of the number of power drivers 104 included in a particular semiconductor package 106, e.g., the voltage value $ADDR_2$ on the ADDR pin of power driver $104_2$ will be the same regardless of the number of include power drivers 104 due to the use of resistor $RV_{Max}$-$RV_{Cum}$ to make up the difference. While $RV_{Max}$-$RV_{Cum}$ is illustrated as being disposed between the last power driver $104_N$ and GND, in other embodiments, $RV_{Max}$-$RV_{Cum}$ may alternatively be disposed between VCC and the first power driver $104_1$.

In some embodiments, power drivers 104 may also comprise an ADDR0 pin that is configured to receive a variety of inputs depending on the particular configuration that is desired. As an example, the ADDR0 pin may receive a VCC input, a GND input, or be a floating input. The value of the ADDR0 pin may be utilized as part of the addressing scheme to create an offset for the addresses of some power drivers 104 relative to other power drivers 104 having the same voltage value on the ADDR pin, enabling the same power driver 104 or semiconductor package 106 configuration to be utilized with additional addresses just by changing the pin connections. As an example, in some embodiments the first thirty-two power drivers 104 may have a particular series of voltages on their ADDR pins and a floating value on their ADDR0 pins, which corresponds to a first thirty-two addresses. The next thirty-two power drivers 104 may have the same series of voltages on their ADDR pins but have the ADDR0 pins connected to VCC, GND or another value, which may be utilized as an offset. For example, in a case where system 100 is configured for sixty-four power drivers 104, 5-bits may be utilized to address thirty-two power drivers 104 based on the value of the ADDR pin, and one bit may be utilized for the offset found on the ADDR0 pin, enabling sixty-four power drivers 104 to be addressed using the combination of the values on the ADDR and ADDR0 pins.

Figure 2:
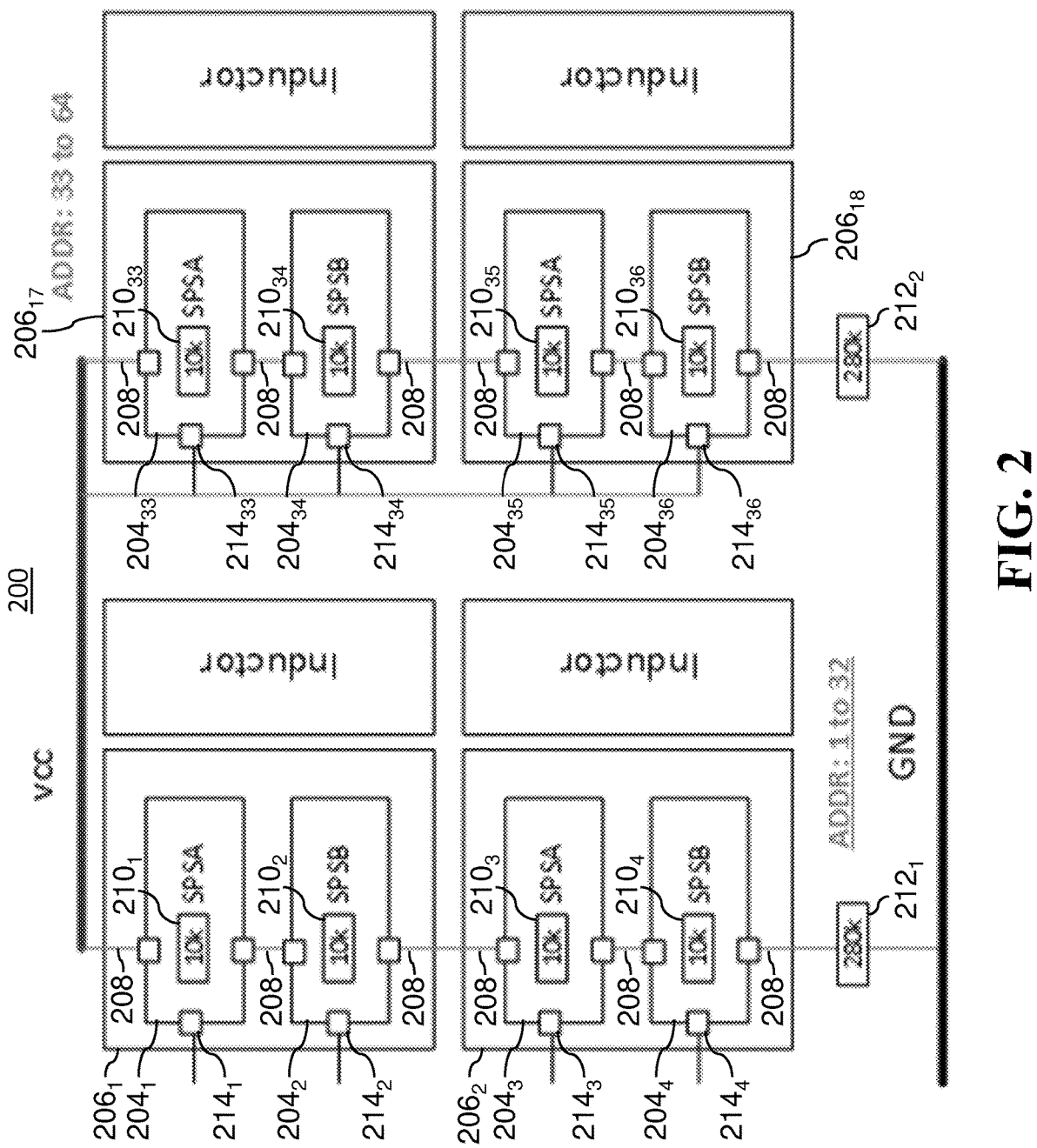
FIG. 2 is a diagram of an example addressing scheme configuration of the system of FIG. 1 according to an embodiment.

With reference to FIG. 2, an example configuration 200 of system 100 for implementing a series addressing scheme will be described according to an embodiment. While only some features, components and functionality are illustrated in FIG. 2, configuration 200 may also or alternatively comprise any of the features, components and functionality described above for system 100. Configuration 200 comprises power drivers $204_1$, $204_2$, $204_3$, $204_4$, $204_{33}$, $204_{34}$, $204_{35}$ and $204_{36}$, also collectively and individually referred to herein as power drivers 204. While only eight power drivers 204 are illustrated in FIG. 2, any other number of power drivers 204 may alternatively be included depending on the particular system requirements. As an example, in a scenario where controller 102 (FIG. 1) may handle up to sixty-four power drivers 204, up to sixty-four power drivers 204 may be included according to the configuration illustrated in FIG. 2 with a minor modification to the resistance of resistors $212_1$ and $212_2$ as described above for resistor $RV_{MAX}$-$RV_{Cum}$ of FIG. 1.

Two or more of power drivers 204 may be formed on the same silicon die as semiconductor packages 206. As an example, configuration 200 may comprise a semiconductor package $206_1$ comprising power drivers $204_1$ and $204_2$, a semiconductor package $206_2$ comprising power drivers $204_3$ and $204_4$, a semiconductor package $206_{17}$ comprising power drivers $204_{33}$ and $204_{34}$ and a semiconductor package $206_{18}$ comprising power drivers $204_{35}$ and $204_{36}$. Semiconductor packages $206_1$, $206_2$, $206_{17}$ and $206_{18}$ may also be collectively and individually referred to herein as semiconductor packages 206. While only four semiconductor packages 206 are illustrated, any other number of semiconductor packages 206 may also or alternatively be included in configuration 200. As an example, where configuration 200 is configured to handle up to sixty-four power drivers 204, thirty-two semiconductor packages 206 each comprising two power drivers 204 may be included in configuration 200. In other embodiments, the same semiconductor package 206 may comprise one, two or any other number of power drivers 204.

In the embodiment of FIG. 2, the ADDR pins of each power driver 204 for a range of addresses, e.g., ADDR 1 to 32 and ADDR 33 to 64, is connected in a daisy chain between VCC and GND. For example, power drivers 204 corresponding to any of addresses 1 to 32 may be connected in a daisy chain between VCC and GND and power drivers 204 corresponding to any of addresses 33 to 64 may be separately connected between VCC and GND.

The connections between VCC, the power drivers 204 and GND are labeled as connections 208, with each power driver

204 having a corresponding resistor $210_1$, $210_2$, $210_3$, $210_4$, . . . , $210_{33}$, $210_{34}$, $210_{35}$, $310_{36}$, e.g., as described above for FIG. 1 for resistors RV. Resistors $210_1$, $210_2$, $210_3$, $210_4$, . . . , $210_{33}$, $210_{34}$, $210_{35}$, $310_{36}$ may also be collectively and individually referred to herein as resistor(s) 210. While multiple connections 208 for the ADDR pin of each power driver 204 are illustrated in FIG. 2 for the purposes of explanation of the configuration and addressing scheme, in some embodiments, each power driver 204 utilizes a single ADDR pin, for example, as shown for power drivers 104 in the wiring diagram of FIG. 1. Similarly, while resistors 210 are illustrated on or above each power driver 204 and not specifically connected to the input/output connections 208, the wiring for such resistors may be implemented in a manner such as that shown for resistors RV of FIG. 1 to provide the corresponding voltage differences on the ADDR pins of power drivers 204 as described above.

Each power driver 204 is also illustrated with an ADDR0 pin connection $214_1$, $214_2$, $214_3$, $214_4$, . . . , $214_{33}$, $214_{34}$, $214_{35}$, $214_{36}$ that may be connected to a variety of inputs including, e.g., VCC, GND, floating (not connected) or any other connection to provide the offset for different address ranges, e.g. addresses 1 to 32 and addresses 33-64. ADDR0 pin connections $214_1$, $214_2$, $214_3$, $214_4$, . . . , $214_{33}$, $214_{34}$, $214_{35}$, $214_{36}$ may also be referred to collectively and individually herein as ADDR0 pin connection(s) 214.

In the embodiment shown in FIG. 2, configuration 200 utilizes floating ADDR0 pin connections 214 for one range of addresses, e.g., addresses 1 to 32, ADDR0 pin connections 214 to VCC for another range of addresses, e.g., addresses 33 to 64. While only four power drivers 204 are shown for each address range, accompanied by a corresponding resistor 212, in other embodiments any other number of power drivers may be included for each address range, e.g., up to thirty-two for each address range in some embodiments. Any other number of power drivers 204 or size of address ranges may alternatively be utilized depending on the voltage input provided for addressing and the precision desired for the voltage differentials between various addresses.

In configuration 200, each power driver 204 for address range 1 to 32 receives a different voltage at its corresponding ADDR pin that corresponds to its address, e.g., based on the voltage drops of the corresponding resistors 210. Similarly, each power driver 204 for address range 33 to 64 also receives a different voltage at its corresponding ADDR pin that corresponds to its address. In some embodiments, the voltages on the ADDR pins for power drivers 1 through 32 and power drivers 33 through 64, respectively may be the same. In order to differential between the two address ranges, the ADDR0 pin connections 214 of the power drivers 204 for address range 1 to 32 may be floating while the ADDR0 pin connections 214 of the power drivers 204 for address range 33 to 64 may be connected to VCC which acts as an offset.

Figures 3, 4:
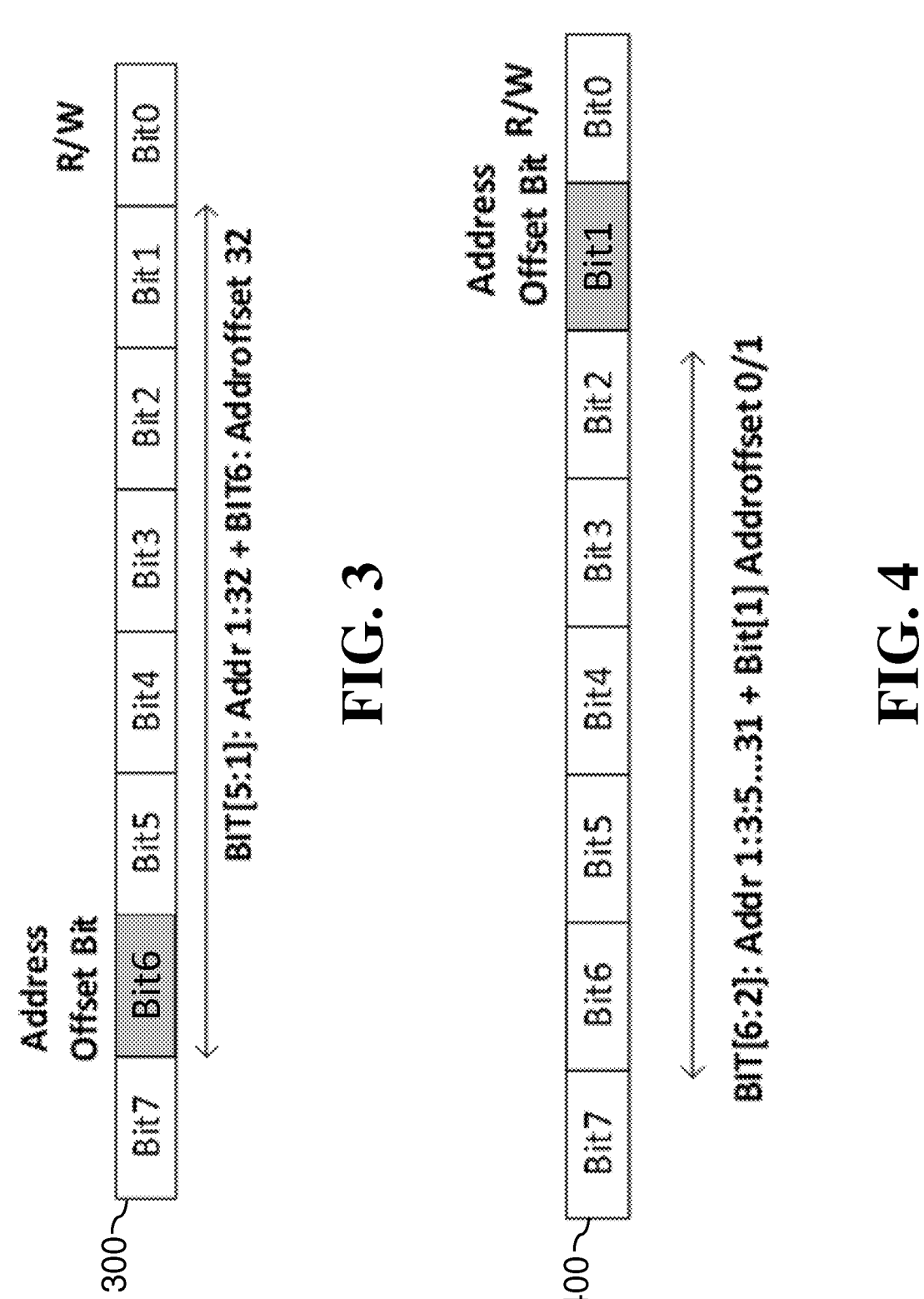
FIGS. 3 and 4 are diagrams of example addressing register configurations of the system of FIG. 1 according to an embodiment.

With reference to FIGS. 3 and 4, for example, the voltages at the ADDR and ADDR0 pins of each power driver 204 may be converted to digital values and written to a register 300/400 of the power driver 204. As an example, the voltage value on the ADDR pin for power driver $204_1$ may be converted to a 5-bit value, e.g., using an analog-to-digital converter and other processing circuitry. Similarly, the voltage value on the ADDR0 pins of each power driver 204 may also be converted to digital values, e.g., to a 1-bit value. Other numbers of bits or values may alternatively be utilized for each of the addresses and offsets. As an example, in other embodiments, two bits may be utilized for the offset, expanding the range of available addresses from 64 to 128. Similarly, a 6-bit address may also double the number of addresses, although such doubling may require more voltage overhead for determining the addresses.

As shown in the example register 300 of FIG. 3, Bit0 may correspond to a read/write flag, which indicates to controller 102 whether or not this register is for reading or writing. Bit1-Bit5 correspond to addresses 1 to 32, e.g., 00000 may correspond to address 1 and 11111 may correspond to address 32. Other addressing may alternatively be utilized in other embodiments, e.g., 11111 may correspond to address 1 while 00000 may correspond to address 32. Bit6, which may be referred to as the most significant address bit, may correspond to the offset, e.g., a value of 0 may correspond to address range 1 to 32 while a value of 1 may correspond to address range 33 to 64. The use of ADDR0 as an offset enables the same power driver circuitry and connections to be utilized for a broader range of addresses while maintaining the same voltage requirements in terms of the voltage value/deferential of VCC relative to GND, the required resistance of resistors 210, and the available range and tolerance of the voltages corresponding to each address.

With reference to FIG. 4, an alternative bit arrangement for register 400 may also or alternatively be utilized where, for example, Bit0 corresponds to the read/write flag, Bit1 corresponds to the offset from ADDR0 and Bit2-Bit6 corresponds to the addresses. Any other arrangement may be utilized.

Figure 5:
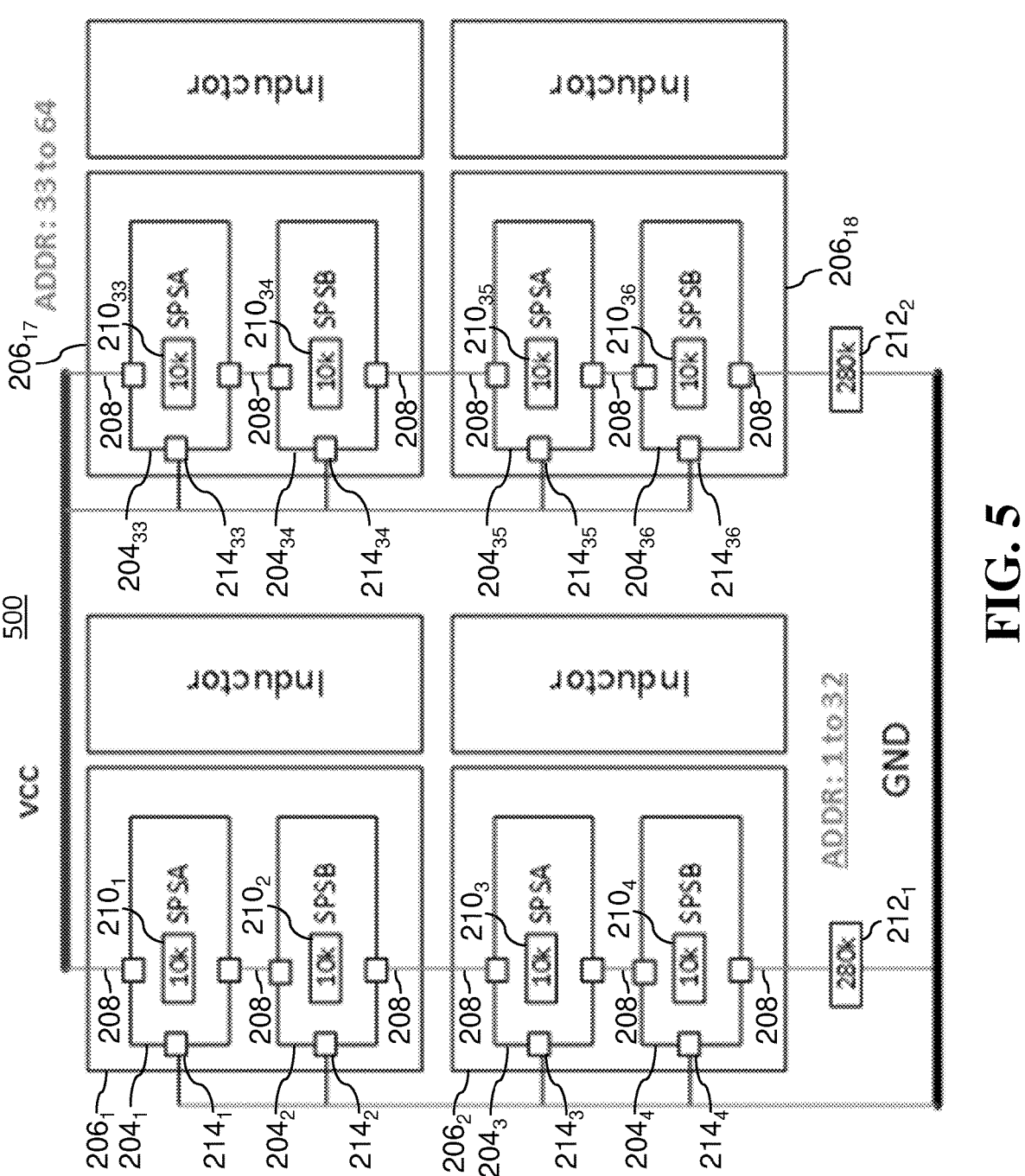
FIG. 5 is a diagram of an example addressing scheme configuration of the system of FIG. 1 according to an embodiment.

With reference to FIG. 5, another example configuration 500 is illustrated according to an embodiment. Configuration 500 comprises similar components and functionality to configuration 200 except that the ADDR0 connections for the power drivers correspond to addresses 1 to 32 are connected to GND instead of floating. In an alternative embodiment, the ADDR0 connections for addresses 1 to 32 may be connected to VCC while the ADDR0 connections for addresses 33 to 64 may be connected to GND. In another alternative embodiment, the ADDR0 connections for addresses 1 to 32 may be floating while the ADDR0 connections for addresses 33 to 64 may be connected to GND. In another alternative embodiment, the ADDR0 connections for addresses 1 to 32 may be connected to GND or VCC while the ADDR0 connections for addresses 33 to 64 may be floating.

Figure 6:
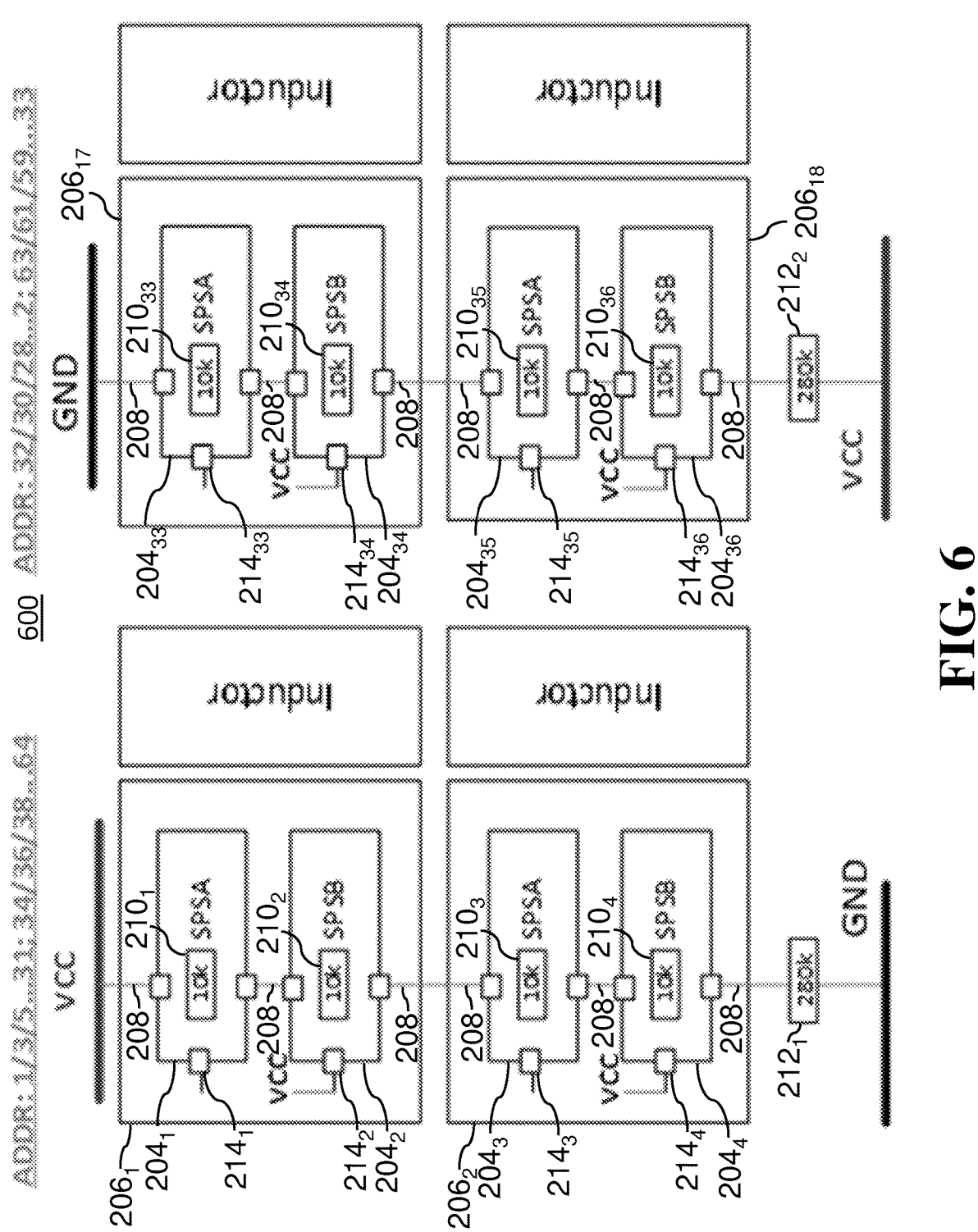
FIG. 6 is a diagram of an example addressing scheme configuration of the system of FIG. 1 according to an embodiment.

With reference to FIG. 6, another example configuration 600 is illustrated according to an embodiment. Configuration 600 comprises similar components and functionality to configuration 200. In configuration 600, one of the two ADDR0 connections in each semiconductor package 206 is connected to VCC and the other is floating. In addition, VCC and GND connections for the ADDR pin are reversed for the second set (right side) of semiconductor packages 206 as compared to the first set (left side) of semiconductor packages 206. In a case where only two semiconductor packages 206 are present on each side, for example, VCC on the left side is connected power driver $204_1$ (via resistor $210_1$), with resistor $212_1$ being connected between power driver $204_4$ and GND. VCC on the right side is connected to resistor $212_2$ before being connected to power driver $204_{36}$ (via resistor $21036$) and power driver $204_{33}$ is connected to GND. As shown in FIG. 6, the left side of configuration 600 may correspond to addresses 1, 3, 5, . . . 31 and 34, 36, 38 . . . 64 while the right side of configuration 600 may correspond to addresses 32, 30, 28, . . . , 2 and 63, 61, 59, . . . , 33. Other addresses correspondences may alternatively be utilized. Configuration 600 enables the fabrication of a semiconductor package 206 having one less offset pin as compared to configuration 200. For example, since the ADDR0 of one of the power drivers 204 is always floating and the other is connected to VCC (or GND), only one offset pin may be needed on the semiconductor package 206 according to configuration 600, reducing the complexity of the semiconductor package and its fabrication.

Figure 7:
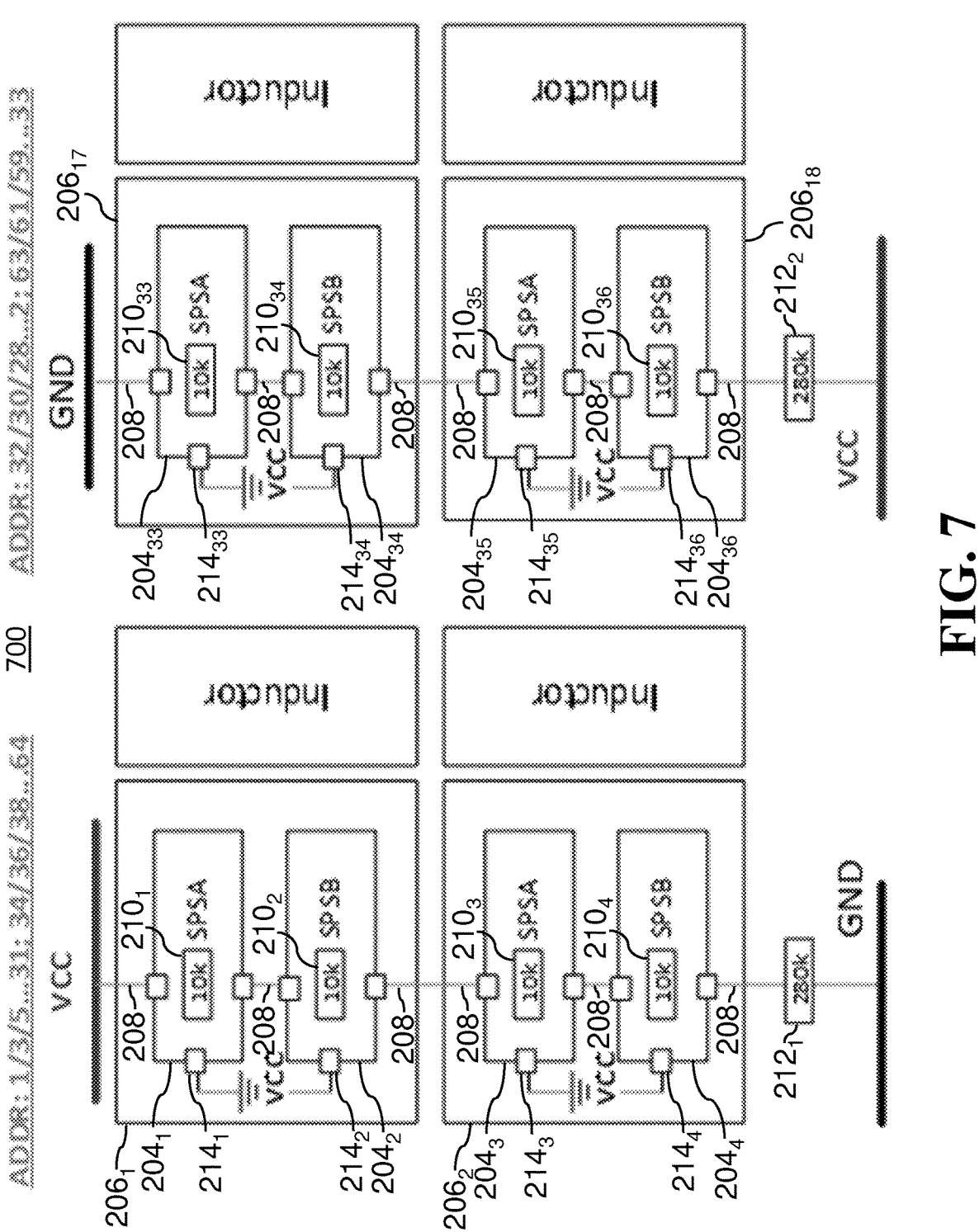
FIG. 7 is a diagram of an example addressing scheme configuration of the system of FIG. 1 according to an embodiment.

With reference to FIG. 7, another example configuration 700 is illustrated according to an embodiment. Configuration 700 comprises similar components and functionality to configuration 600 except that one of the two ADDR0 connections in each semiconductor package 206 is connected to VCC and the other is connected to GND. Address correspondences may be determined in a similar manner to that described above for configuration 600. In another embodiment, one of the two ADDR0 connections in each semiconductor package 206 may be floating and the other may be connected to GND. The first set (left side) and the second set (right side) may have different ADDR0 connections, e.g., VCC/floating, VCC/GND, floating/GND or any other combination.

Figures 8, 9:
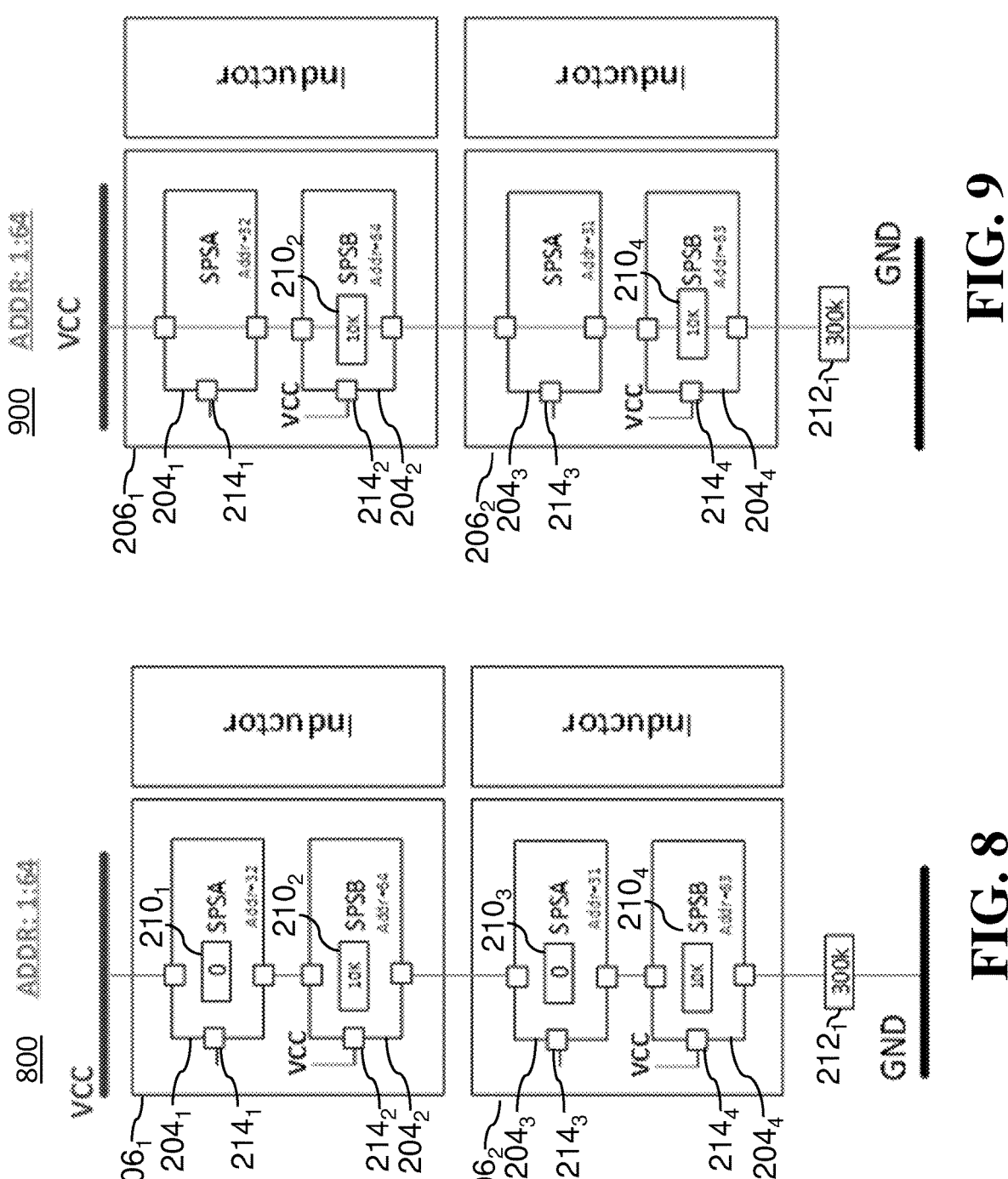
FIG. 8 is a diagram of an example addressing scheme configuration of the system of FIG. 1 according to an embodiment.
FIG. 9 is a diagram of an example addressing scheme configuration of the system of FIG. 1 according to an embodiment.

With reference to FIG. 8, another example configuration 800 is illustrated according to an embodiment. Configuration 800 comprises similar components and functionality to configuration 600 except that the entire address range of power drivers 204 may be disposed between VCC and ground in a daisy chain instead of reversing VCC and GND for half of the addresses. In configuration 800, with one of the two ADDR0 connections in each semiconductor package 206 floating and the other can be connected to VCC or GND, and with one of the resistors 210 of each semiconductor package 206 having zero ohm, the voltages on the ADDR pin of each power driver 204 will have the same voltage and ADDR0 will be utilized to determine an offset between the two.

With reference to FIG. 9, another example configuration 900 is illustrated according to an embodiment. Configuration 900 comprises similar components and functionality to configuration 800 except that one of the power drivers 204 of each semiconductor package 206 does not have a corresponding resistor 210. Because only one of the power drivers 204 has a corresponding resistor 210, both power drivers 204 of the same semiconductor package 206 will have the same voltage on the ADDR pin but different voltages on the ADDR0 pin which are utilized to differentiate between the two by changing the offset bit value. Configuration 900 reduces circuit complexity and fabrication complexity by saving one resistor relative to configurations 200, and 500-800.

Figure 10:
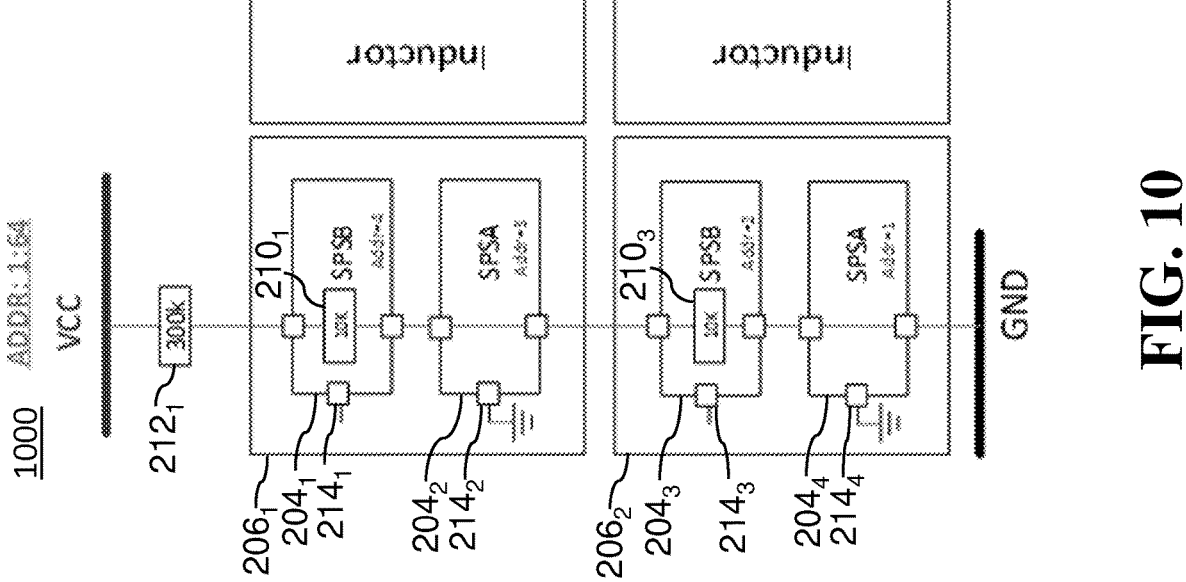
FIG. 10 is a diagram of an example addressing scheme configuration of the system of FIG. 1 according to an embodiment.

With reference to FIG. 10, another example configuration 1000 is illustrated according to an embodiment. Configuration 1000 comprises similar components and functionality to configuration 900 except that the ADDR0 pin of one of the power drivers 204 is connected to GND and the other is floating. Because only one of the power drivers 204 has a corresponding resistor 210, both power drivers 204 of the same semiconductor package 206 will have the same voltage on the ADDR pin but different voltages on the ADDR0 pin (floating and GND) which are utilized to differentiate between the two by changing the offset bit value. Configuration 1000 reduces circuit complexity and fabrication complexity by saving one resistor relative to configurations 200, and 500-800.

Figure 11:
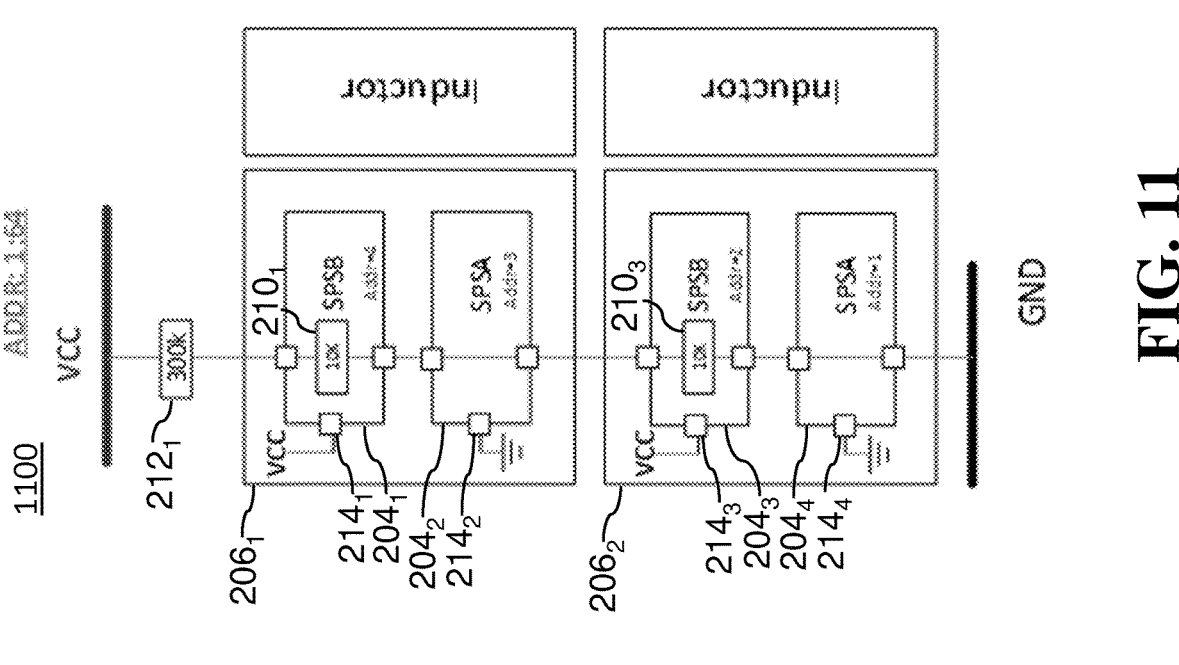
FIG. 11 is a diagram of an example addressing scheme configuration of the system of FIG. 1 according to an embodiment.

With reference to FIG. 11, another example configuration 1100 is illustrated according to an embodiment. Configuration 1100 comprises similar components and functionality to configuration 900 except that the ADDR0 pin of one of the power drivers 204 is connected to GND and the other is connected to VCC. Because only one of the power drivers 204 has a corresponding resistor 210, both power drivers 204 of the same semiconductor package 206 will have the same voltage on the ADDR pin but different voltages on the ADDR0 pin (VCC and GND) which are utilized to differentiate between the two by changing the offset bit value. Configuration 1100 reduces circuit complexity and fabrication complexity by saving one resistor relative to configurations 200, and 500-800.

Configurations 800-1100 also reduce circuit and fabrication complexity by connecting the ADDR pins of all semiconductor packages 206 and their power drivers 204 in series to generate 64 distinct addresses instead of having two separate series daisy chains for addresses 1-32 and 33-64.

Figure 12:
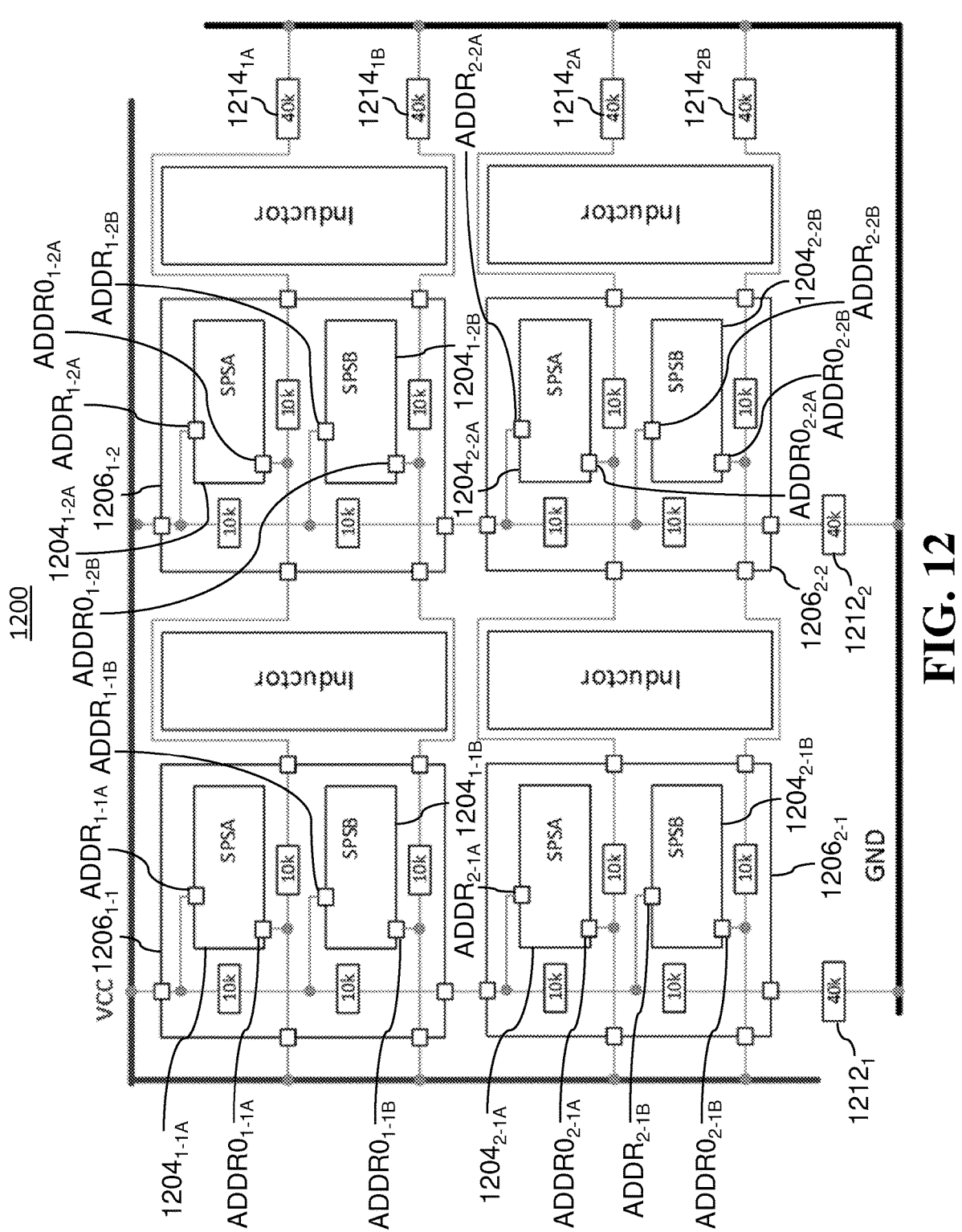
FIG. 12 is a diagram of an example addressing scheme configuration of the system of FIG. 1 according to an embodiment.

With reference to FIG. 12, another example configuration 1200 is illustrated according to an embodiment. Configuration 1200 may comprise some similar components and functionality to any of configurations 200 through 900. Configuration 1200 comprises semiconductor packages $1206_{1-1}$, $1206_{1-2}$, $1206_{2-1}$ and $1206_{2-2}$, also referred to collectively and individually as semiconductor package(s) 1206. Semiconductor packages 1206 comprise corresponding power drivers $1204_{1-1A}$, $1204_{1-1B}$, $1204_{1-2A}$, $1204_{1-2B}$, $1204_{2-1A}$, $1204_{2-1B}$, $1204_{2-2A}$ and $1204_{2-2B}$, also collectively and individually referred to as power driver(s) 1204. While only four semiconductor packages 1206 each comprising two power drivers 1204 are illustrated in FIG. 12, any other number of semiconductor packages 1206 and power drivers 1204 per semiconductor package 1206 may alternatively be included to achieve the desired number of power drivers 1204 and the desired configuration.

In the embodiment of FIG. 12, each power driver 1204 has a corresponding ADDR pin and a corresponding ADDR0 pin, e.g., $ADDR_{1-1A}$, $ADDR_{1-1B}$, $ADDR_{1-2A}$, $ADDR_{1-2B}$, $ADDR_{2-1A}$, $ADDR_{2-1B}$, $ADDR_{2-2A}$ $ADDR_{2-2B}$, $ADDR0_{1-1A}$, $ADDR0_{1-1B}$, $ADDR0_{1-2A}$, $ADDR0_{1-2B}$, $ADDR0_{2-1A}$, $ADDR0_{2-1B}$, $ADDR0_{2-2A}$ and $ADDR0_{2-2B}$.

Depending on the number of power drivers 1204 being implemented as compared to a predetermined maximum number of power drivers 1204, corresponding resistors $1212_1$, $1212_2$, $1214_{1A}$, $1214_{1B}$, $1214_{2A}$ and $1214_{2B}$ may be utilized in a similar manner to that described above for resistors 212. In configuration 1200, for example, a smaller resistance may be utilized for resistors 1212 as compared to resistors 212 due to the smaller number of power drivers 1204 on each series daisy chain whether they are for PWM groups or PWM phases.

Power drivers 1204 are arranged by PWM group and PWM phase in a bi-directional address daisy chain. A PWM group corresponds to a group of power drivers 1204 each controlled by separate corresponding PWM signal. A PWM phase corresponds to power drivers 1204 that use the same PWM signal, also sometimes referred to herein as a parallel group. For example, power drivers $1204_{1-1A}$, $1204_{1-1B}$, $1204_{2-1A}$ and $1204_{2-1B}$ are arranged in a first vertical group, also referred to as group 1, power drivers $1204_{1-2A}$, $1204_{1-2B}$, $1204_{2-2A}$ and $1204_{2-2B}$ are arranged in a second vertical group, also referred to as group 2, power drivers $1204_{1-1A}$ and $1204_{1-2A}$ are arranged in a first horizontal phase, also referred to as phase 1, power drivers $1204_{1-1B}$ and $1204_{1-2B}$ are arranged in a second horizontal phase, also referred to as phase 2, power drivers $1204_{2-1A}$ and $1204_{2-2A}$ are arranged in a third horizontal phase, also referred to as phase 3, and power drivers $1204_{2-1B}$ and $1204_{2-2B}$ are arranged in a fourth horizontal phase, also referred to as phase 3. The terms vertical and horizontal refer to the orientation of FIG. 12, not to any particular alignment or configuration of the circuitry itself. While only four power drivers 1204 are illustrated in FIG. 12 for each group and two power drivers 1204 are described for each PWM phase, in other embodiments a greater or smaller number of power drivers 1204 may be included for each of the PWM groups and PWM phases. Similarly, while only two PWM groups and four PWM phases are illustrated in FIG. 12, in other embodiments, a greater or smaller number of PWM groups or PWM phases may be included.

In PWM group 1, power driver $1204_{1\text{-}1A}$ is controlled by a PWM signal 1, power driver $1204_{1\text{-}1B}$ is controlled by a PWM signal 2, power driver $1204_{2\text{-}1A}$ is controlled by a PWM signal 3 and power driver $1204_{2\text{-}1B}$ is controlled by a PWM signal 4. In PWM group 2, power driver $1204_{1\text{-}2A}$ is controlled by PWM signal 1, power driver $1204_{1\text{-}2B}$ is controlled by PWM signal 2, power driver $1204_{2\text{-}2A}$ is controlled by PWM signal 3 and power driver $1204_{2\text{-}2B}$ is controlled by PWM signal 4. In PWM phase 1, power drivers $1204_{1\text{-}1A}$ and $1204_{1\text{-}2A}$ are both controlled by PWM signal 1 with power driver $1204_{1\text{-}1A}$ corresponding to group 1 and power driver $1204_{1\text{-}2A}$ corresponding to group 2. In PWM phase 2, power drivers $1204_{1\text{-}1B}$ and $1204_{1\text{-}2B}$ are both controlled by PWM signal 2 with power driver $1204_{1\text{-}1B}$ corresponding to group 1 and power driver $1204_{1\text{-}2B}$ corresponding to group 2. In PWM phase 3, power drivers $1204_{2\text{-}1A}$ and $1204_{2\text{-}2A}$ are both controlled by PWM signal 3 with power driver $1204_{2\text{-}1A}$ corresponding to group 1 and power driver $1204_{2\text{-}2A}$ corresponding to group 2. In PWM phase 4, power drivers $1204_{2\text{-}1B}$ and $1204_{2\text{-}2B}$ are both controlled by PWM signal 4 with power driver $1204_{2\text{-}1B}$ corresponding to group 1 and power driver $1204_{2\text{-}2B}$ corresponding to group 2.

Each PWM group is connected together between VCC and GND by the ADDR pins of the corresponding power drivers 1204 through corresponding resistors, e.g., 10 k resistors as shown or another resistor value. Each PWM phase is connected together between VCC and GND by the ADDR0 pins of the corresponding power drivers 1204 through corresponding resistors, e.g., 10 kΩ resistors as shown or another resistor value. The resistors are not individually labeled to allow for clarity and avoid clutter in FIG. 12. In an example embodiment, there may be up to eight PWM groups and eight PWM phases where, for example, each PWM group 1, 2, . . . , 8 has up to eight power drivers 1204 driven by corresponding PWM signals 1, 2, . . . 8. Similarly, each PWM phase may have up to eight power drivers 1204 driven by the same PWM signal across multiple PWM groups.

In an embodiment, a total phase count of 24 may be utilized where, for example, the configuration may comprise eight PWM groups with three PWM phases, six PWM groups with four PWM phases, four PWM groups with six PWM phases, or any other combination of PWM groups and PWM phases that achieves a total phase count of 24. A total phase count of 24 results in addressing for twenty-four power drivers 1204. Any other number or combination of PWM groups and PWM phases may alternatively be utilized, e.g., eight PWM groups and eight PWM phases to achieve addressing for a full 64 power drivers 1204 or another number of PWM groups and PWM phases for any other target number of power drivers 1204.

Configuration 1200 enables controller 102 to directly identify the number of PWM phases and parallel devices. For example, using PWM, controller 102 may determine how many power drivers 1204 share each PWM signal and how many PWM signals are in use.

As shown in FIG. 12, configuration 1200 utilizes six address pins and four resistors for each semiconductor package 1206. This is in contrast to configurations 200 and 500-1100 which utilize four address pins and only one or two resistors in each semiconductor package 206. For example, a semiconductor package 1206 according to configuration 1200 utilizes an input ADDR pin connection, an output ADDR pin connection, an ADDR0 input connection for a first PWM phase, an ADDR0 input connection for a second PWM phase, an ADDR0 output connection for the first PWM phase and an ADDR0 output connection for the second PWM phase. Similarly, a semiconductor package 1206 includes a pair of resistors disposed between the input and output ADDR pin connections, a resistor disposed between each of the input and output ADDR0 pin connections for the first PWM phase and a resistor disposed between each of the input and output ADDR0 pin connections for the second PWM phase. In some embodiments one or more additional external resistors may also be utilized depending on the number of PWM groups and PWM phases.

Figure 13:
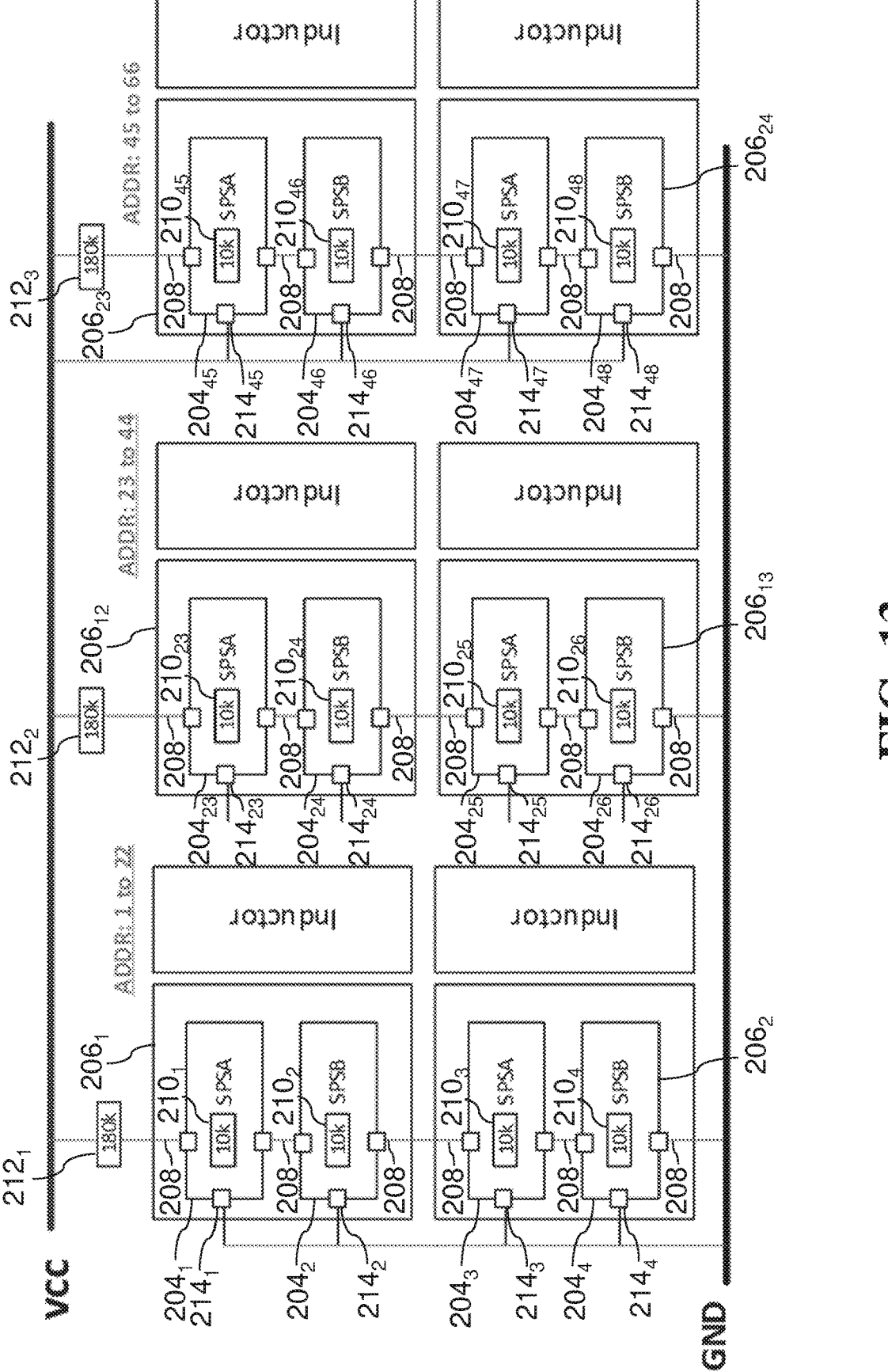
FIG. 13 is a diagram of an example addressing scheme configuration of the system of FIG. 1 according to an embodiment.

With reference now to FIG. 13, another example configuration 1300 is illustrated according to an embodiment. Configuration 1300 comprises similar components and functionality to configuration 200 except that the semiconductor packages 206 are split into three address ranges, 1 to 22, 23 to 44, and 45 to 66 where the power drivers 204 corresponding to each address range are connected together between VCC and GND by their respective ADDR pins through corresponding resistors, e.g., 10 k resistors as shown or another resistor value. In this embodiment, breaking the address ranges into three smaller parts allows more voltage headroom to be available for each address, e.g., 22 distinct addresses in configuration 1300 vs 32 distinct addresses in configuration 200 for the same voltage differential between VCC and GND. In this embodiment, configuration 1300 utilizes three offset pin options, VCC, GND and floating to create a total of 66 distinct addresses. The offset pin may be converted to an offset value in one or more register bits, e.g., two bits instead of just one bit as shown in FIGS. 3 and 4, to handle the three offset values. In some embodiments, the addresses may be split into four address ranges to take full advantage of a two-bit offset and further expand the available voltage headroom available for each address or to add additional addresses.

The series addressing scheme configurations described according to the embodiments herein provide the capability to address a large number of devices with minimal circuitry footprint by taking advantage of both voltage dividers and offsets. The configurations described herein also provide the capability to use the same silicon die for a semiconductor package that may be utilized in a variety of addressing scheme configurations based on the input and output signals connected to the corresponding address pins.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A semiconductor device package comprising:
an address voltage supply pin connection;
an address voltage output pin connection;
a first power driver having a first address pin connection, the first address pin connection being connected to the address voltage supply pin connection via a resistor, the first power driver being configured to generate a first indication of a first address corresponding to the first power driver based on a voltage on the first address pin connection, the first indication being obtainable by a controller to determine the first address of the first power driver; and
a second power driver having a second address pin connection, the second address pin connection being connected to the first address pin connection and the address voltage output pin connection, the second power driver being configured to generate a second indication of a second address corresponding to the second power driver based on a voltage on the second address pin connection, the second indication being obtainable by the controller to determine the second address of the second power driver, wherein:
the first power driver has a first offset pin;
the second power driver has a second offset pin;
the resistor comprises a first resistor;
the semiconductor device package further comprises a first offset input pin, a second offset input pin, a first offset output pin and a second offset output pin;
the first offset input pin is connected to the first offset pin;
the first offset output pin is connected to the first offset pin via a second resistor, a voltage on the first offset output pin being smaller than a voltage on the first offset input pin;
the second offset input pin is connected to the second offset pin; and
the second offset output pin is connected to the second offset pin via a third resistor, a voltage on the second offset output pin being smaller than a voltage on the second offset input pin.

2. The semiconductor device package of claim 1, wherein the resistor comprises a first resistor and the second address pin connection is connected to the first address pin connection via a second resistor, the voltage on the first address pin connection being different than the voltage on the second address pin connection.

3. The semiconductor device package of claim 2, wherein the first and second resistors have the same resistance value.

4. The semiconductor device package of claim 1, wherein the voltage on the first address pin connection is the same as the voltage on the second address pin connection.

5. The semiconductor device package of claim 1, wherein:
the first power driver is configured to generate the first indication of the first address corresponding to the first power driver based on the voltage on the first address pin connection and a voltage on the first offset pin; and
the second power driver is configured to generate the second indication of the second address corresponding to the second power driver based on the voltage on the second address pin connection and a voltage on the second offset pin, the first address and the second address being different.

6. The semiconductor device package of claim 5, wherein the first offset pin and the second offset pin are 1) both connected to the same voltage supply, 2) both connected to ground or 3) both floating.

7. The semiconductor device package of claim 5, wherein:
the first offset pin is one of 1) connected to a voltage supply, 2) connected to ground or 3) floating;
the second offset pin is another of 1) connected to the voltage supply, 2) connected to ground or 3) floating;
the first and second address pin connections have the same voltage; and
the first and second indications are differentiated based on voltage values on the corresponding first and second offset pins.

8. A system comprising:
a voltage power supply connection;
a ground connection;
a first power driver having a first address pin connection and a first offset pin connection, the first power driver being configured to generate a first indication of a first address corresponding to the first power driver based on a voltage on the first address pin connection and a voltage on the first offset pin connection, the first indication being obtainable by a controller to determine the first address of the first power driver;
a second power driver having a second address pin connection and a second offset pin connection, the second power driver being configured to generate a second indication of a second address corresponding to the second power driver based on a voltage on the second address pin connection and a voltage on the second offset pin connection, the second indication being obtainable by a controller to determine the second address of the second power driver, the first address pin connection and the second address pin connection being electrically connected in series between the voltage power supply connection and the ground connection via at least a first resistor;
a third power driver having a third address pin connection and a third offset pin connection, the third power driver being configured to generate a third indication of a third address corresponding to the third power driver based on a voltage on the third address pin connection and a voltage on the third offset pin connection, the third indication being obtainable by a controller to determine the third address of the third power driver; and
a fourth power driver having a fourth address pin connection and a fourth offset pin connection, the fourth power driver being configured to generate a fourth indication of a fourth address corresponding to the fourth power driver based on a voltage on the fourth address pin connection and a voltage on the fourth offset pin connection, the fourth indication being obtainable by a controller to determine the fourth address of the fourth power driver, the third address pin connection and the fourth address pin connection being electrically connected in series between the voltage power supply connection and the ground connection via at least a second resistor;

a first offset input pin is connected to the first offset pin connection;

a first offset output pin is connected to the first offset pin connection via a third resistor, a voltage on the first offset output pin being smaller than a voltage on the first offset input pin;

a second offset input pin is connected to the second offset pin connection;

a second offset output pin is connected to the second offset pin connection via a fourth resistor, a voltage on the second offset output pin being smaller than a voltage on the second offset input pin;

a third offset input pin is connected to the third offset pin connection;

a third offset output pin is connected to the third offset pin connection via a fifth resistor, a voltage on the third offset output pin being smaller than a voltage on the third offset input pin;

a fourth offset input pin is connected to the fourth offset pin connection; and a fourth offset output pin is connected to the fourth offset pin connection via a sixth resistor, a voltage on the fourth offset output pin being smaller than a voltage on the fourth offset input pin.

9. The system of claim 8, wherein the first and second offset pin connections are both one of 1) connected to the voltage power supply connection, 2) connected to the ground connection or 3) floating and the third and fourth offset pin connections are both another of 1) connected to the voltage power supply connection, 2) connected to the ground connection or 3) floating.

10. The system of claim 8, wherein the first and third offset pin connections are both one of 1) connected to the voltage power supply connection, 2) connected to the ground connection or 3) floating and the second and fourth offset pin connections are both another of 1) connected to the voltage power supply connection, 2) connected to the ground connection or 3) floating.

11. The system of claim 8, wherein:

the first resistor is electrically disposed between the first address pin connection and the voltage power supply connection; and a third resistor is electrically disposed between the first address pin connection and the second address pin connection, the first and second address pin connections having different voltages based on the first and third resistors.

12. The system of claim 11, wherein:

the second resistor is electrically disposed between the third address pin connection and the voltage power supply connection, the first and second resistors having the same resistance value;

a fourth resistor is electrically disposed between the third address pin connection and the fourth address pin connection, the third and fourth resistors having the same resistance value;

the first and third address pin connections have the same voltage based on the first and second resistors; and the second and fourth address pin connections have the same voltage based on the third and fourth resistors.

13. The system of claim 12, wherein:

the first indication of the first address is different than the third indication of the third address based on the first offset pin connection and the third offset pin connection having different voltages; and the second indication of the second address is different than the fourth indication of the fourth address based on the second offset pin connection and the fourth offset pin connection having different voltages.

14. The system of claim 8, further comprising a plurality of power drivers comprising the first and second power drivers, wherein:

a number of power drivers in the plurality of power drivers is less than a predetermined number of power drivers; and the second address pin connection is electrically connected in series to the ground connection via a third resistor, the third resistor having a resistance corresponding to a difference between the predetermined number of power drivers and the number of power drivers in the plurality of power drivers.

15. The system of claim 8, wherein:

the first and third offset pin connections are electrically connected in series between the voltage power supply connection and the ground connection via at least a third resistor; and the second and fourth offset pin connections are electrically connected in series between the voltage power supply connection and the ground connection via at least a fourth resistor.

16. The system of claim 15, further comprising a plurality of power drivers comprising the first and third power drivers, wherein:

a number of power drivers in the plurality of power drivers is less than a predetermined number of power drivers; and the third offset pin connection is electrically connected in series to the ground connection via a fifth resistor, the fifth resistor having a resistance corresponding to a difference between the predetermined number of power drivers and the number of power drivers in the plurality of power drivers.

17. A system comprising:

a plurality of semiconductor packages, each semiconductor package comprising:

a first power driver;

a second power driver;

an address pin input connection; and an address pin output connection, wherein the address pin input connection being electrically connected to the address pin output connection internal to the semiconductor package, wherein the first power driver comprising a first address pin electrically connected between the address pin input connection and the address pin output connection, wherein the second power driver comprising a second address pin electrically connected between the address pin input connection and the address pin output connection, and wherein the plurality of semiconductor packages being electrically connected in series between a voltage power supply connection and a ground connection via the address pin input connection and the address pin output connection, at least one resistor being electrically disposed between the address pin input connection and the first and second address pins.

18. The system of claim 17, wherein the at least one resistor being electrically disposed between the address pin input connection and the first and second address pins comprises a first resistor electrically disposed between the address pin input connection and the first address pin and a second resistor electrically disposed between the first resistor and the second address pin, the first and second resistors being electrically disposed between the address pin input connection and the address pin output connection.

19. The system of claim 17, wherein:

first and second address pins are configured to have the same voltage;

each semiconductor package further comprises an offset power supply connection and an offset ground connection;

the first power driver comprises a first offset pin connected to one of 1) the offset power supply connection, 2) the offset ground connection or 3) floating;

the second power driver comprises a second offset pin connected to another of 1) the offset power supply connection, 2) the offset ground connection or 3) floating;

an address of the first power driver of each semiconductor package is determined based on a voltage on the first address pin and a voltage on the first offset pin; and an address of the second power driver of each semiconductor package is determined based on a voltage on the second address pin and a voltage on the second offset pin.

\* \* \* \* \*